United States Patent [19]

Vervoordeldonk et al.

[11] Patent Number: 4,774,158
[45] Date of Patent: Sep. 27, 1988

[54] METHOD OF DETERMINING AN EXPOSURE DOSE OF A PHOTOSENSITIVE LACQUER LAYER

[75] Inventors: Marinus H. M. Vervoordeldonk; Rolandus P. M. J. Leerschool, both of Eindhoven, Netherlands

[73] Assignee: U.S. Philips Corporation, New York, N.Y.

[21] Appl. No.: 910,557

[22] Filed: Sep. 22, 1986

[30] Foreign Application Priority Data

Sep. 26, 1985 [NL] Netherlands .................. 8502624

[51] Int. Cl.⁴ .................................................. G03C 5/00
[52] U.S. Cl. ...................................... 430/30; 430/394; 430/396; 430/494
[58] Field of Search ................ 430/30, 394, 396, 494, 430/325, 326

[56] References Cited

U.S. PATENT DOCUMENTS 3,998,639 12/1976 Feldman et al. ...................... 430/30
4,021,239 5/1977 Ogawa .................................. 430/394

Primary Examiner—Jose' G. Dees
Attorney, Agent, or Firm—Paul R. Miller

[57] ABSTRACT

On a photosensitive lacquer present on a substrate, details having a line width in the range of 0.5 μm–2 μm have to be accurately reproduced in the lacquer layer. In order to determine the exposure does or time, the lacquer layer is exposed through a raster pattern comprising alternately transparent and non-transparent line-shaped regions of the desired width. The raster pattern is then laterally displaced over a distance equal to the line width in a direction at right angles to the longitudinal direction of the lines, after which an exposure is carried out again at the same dose. The process is repeated at a few areas, but at a different exposure dose, after which a reference exposure dose is determined in that it is ascertained what dose is required to just dissolve entirely the photosensitive lacquer layer after development.

2 Claims, 1 Drawing Sheet

METHOD OF DETERMINING AN EXPOSURE DOSE OF A PHOTOSENSITIVE LACQUER LAYER

The invention relates to a method of determining the exposure dose of a photosensitive lacquer layer present on a substrate in order to obtain a lacquer pattern on the substrate, in which after exposure through a mask followed by development of the lacquer, details having a line width in the range of from 0.5 μm to 2 μm have to be accurately reproduced.

In order to obtain lacquer patterns having a very accurate line width for lines in the range of from 0.5 to 2 μm, an exposure at an accurate exposure dose, in general exposure time, is required. An incorrect exposure dose results in a deviation in the line width. In modern semiconductor technology, working with extremely small dimensions with a very great accuracy is of major importance.

The measurement of the line width obtained after exposures of different durations in order to determine the correct exposure dose for obtaining the desired line width meets with difficulties in the micron range. An obvious measuring method utilizes an optical microscope. The reliability is comparatively low in this case, however. The line width in the micron range lies at the limit of possibilities of an optical microscope and with a substantial enlargement, the thickness of the lacquer pattern can exceed the depth of field of the microscope. A further possibility for determining the correct exposure dose consists in measuring the line width obtained by means of a scanning electron microscope. However, for this purpose such an expensive instrument must then be present, while also conditions must be satisfied, which are further imposed on the use of a scanning electron microscope for this measurement.

The invention has for its object to provide a method in which a reference exposure dose or exposure time can be determined in a simple manner, while at the same time the influence of the exposure dose on process conditions, such as the thickness of the lacquer layer, the sensitivity of the lacquer, the furnace temperature when baking out a lacquer, etc., are automatically compensated. In order to achieve this object, according to the invention, the method of the kind mentioned in the opening paragraph is characterized in that a lacquer layer present on the substrate is exposed through a raster pattern, which comprises alternately transparent and non-transparent line-shaped regions of a desired width, and in that then the raster pattern is displaced laterally over a distance equal to the line width in a direction at right angles to the longitudinal direction of the lines, after which another exposure is carried out at the same dose, this process being repeated at a few areas, but at a different exposure dose, after which a reference exposure dose is determined by ascertaining what dose is necessary to just dissolve completely the photosensitive lacquer layer after development.

The invention is based on recognition of the fact that at the area of the transitions from the transparent to the non-transparent parts of the raster the light intensity incident upon the lacquer layer is lower due to scattering and deflection than with the transparent parts. The depth at which at the area of these transitions light penetrates into the lacquer layer is then dependent upon the exposure time. If now, as is the case according to the invention, a raster of desired minimim line width is exposed and is exposed once more after displacement of the raster over the line width at different areas at different exposure doses, for example exposure times, it appears that with comparatively short exposure times lacquer beams remain present after development of the lacquer layer. These beams are clearly visible with an ordinary microscope. With longer exposure times, it appears that the beams are suddenly no longer present. The exposure associated with the situation in which the beams have suddenly disappeared indicates the reference exposure dose.

When experimental exposures and development are carried out in the same process conditions such as those in which, for example, semiconductor wafers for manufacturing purposes will be treated, process conditions cannot lead to deviations. The reference dose need be determined only once for a given lacquer and is then indicative of the exposure of the lacquer on semiconductor wafers to be treated for manufacture.

During treatment of semiconductor wafers, in which there is exposed with a reference exposure dose, i.e. at the dose at which the beams suddenly disappear, it appears that the line width obtained does not correspond to the desired line width. If, however, the exposure time associated with the desired line width is determined, it appears that the difference between the exposure time for the reference exposure dose and the dose associated with the measured correct line width is a constant value for the entire range of desired line widths. An embodiment according to the invention utilizing this fact is characterized in that for a given kind of photosensitive lacquer the exposure is determined which is required to obtain the desired line width, in that the difference with respect to the reference exposure dose obtained in the same process conditions is then determined, and in that for each lot of substrates to be treated an exposure is chosen equal to the sum of the reference exposure dose in the process conditions then to be chosen and the difference value.

The invention will be described more fully with reference to the drawing. In the drawing.

Figure 1:
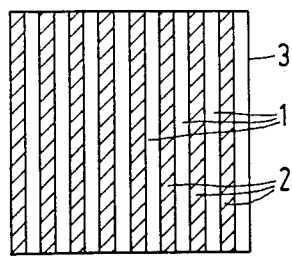
FIG. 1 shows a raster comprising alternately transparent and opaque regions.

FIG. 1 shows a raster constituted by a pattern of transparent and non-transparent line-shaped regions 1, 2 provided on a support 3, for example of glass or of a transparent synthetic material. The regions 1 and 2 have the same width. For determining the exposure dose of a substrate covered with a photosensitive layer in order to obtain a line width of very small dimension, i.e. in the range of from 0.5 to 2 μm, accurately defined in the photolacquer, experimental exposures can be carried out with a number of different line widths of the regions 1 and 2, a number of exposures at doses of different intensities being chosen for each line width.

Let it be assumed that in the raster shown in FIG. 1 both the width of the transparent regions 1 and the width of the non-transparent regions 2 have a value of 1 μm. The support 3 with the raster is provided, for example, in a stepand-repeat camera, at an area at which normally a mask for the exposure of photolacquer is present on a semiconductor wafer. The raster is now exposed, for example, with a flash of light of 120 msec, with the pattern of the raster being projected onto the photolacquer of the semiconductor wafer, for example, in a ratio of 1:1.

Figure 2:
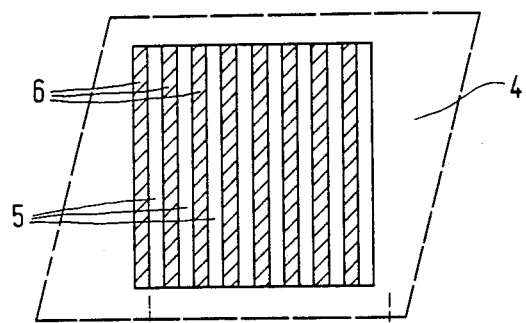
FIG. 2 shows a substrate with a photosensitive lacquer layer exposed through the raster.
Figure 3:
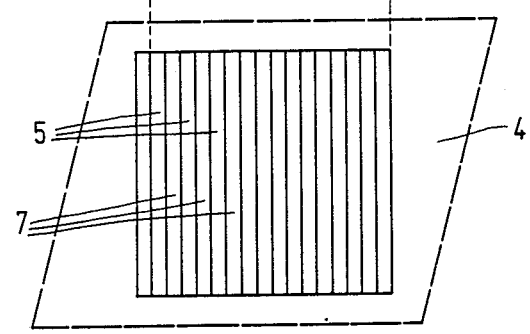
FIG. 3 shows the substrate of FIG. 2, but now exposed a second time.

FIG. 2 shows a part of a substrate 4, which is covered with photolacquer, for example, the positive photolacquer HPR 204 of Hunt Company, which photolacquer is exposed through the raster pattern. The exposed regions of the photolacquer are designated by reference numeral 5 and the non-exposed regions are designated by reference numeral 6. Subsequently, the carriage on which the substrate 4, for example, a semiconductor wafer, is disposed is displaced at right angles to the longitudinal direction of the regions 5 and 6 over a distance equal to half the pitch of the various regions, which is in this case 1 μm. The photolacquer on the substrate 4 is again exposed again to a flash of light of 120 msec. The parts 6 of the photolacquer that were covered with the first exposure through the non-transparent regions 2 of the raster are now exposed with a the second exposure. FIG. 3 shows this situation. The regions exposed for a second time with the second exposure are denoted by reference numeral 7. At a number of different places or areas, a similar exposure step is again carried out, but with different exposure times, for example 130 msec, 140 msec, etc., to 180 msec.

Figure 4:
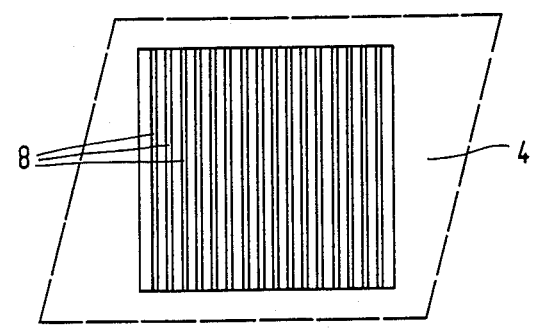
FIG. 4 shows the substrate of FIG. 3, which after development still has lacquer beams.

Upon development of the positive photolacquer exposed and baked out, the exposed parts are dissolved. Although by the double exposure the experimental region is entirely exposed, it is found that with a comparatively short exposure the entire quantity of photolacquer is not dissolved, but that during the projection of the transitional areas between transparent parts and opaque parts of the raster beams 8 of photolacquer remain present (cf. FIG. 4). They are formed because the light due to scattering and deflection cannot penetrate with a sufficient intensity into the lower part of the photolacquer layer. These beams 8 can be clearly observed with an ordinary microscope. With a longer exposure time, the beams are found to have suddenly disappeared. The associated exposure time is the reference exposure for the photosensitive layer employed in the process conditions used. This reference exposure, which can be determined in a simple manner, forms the basis for determining the exposure dose in order to obtain line-shaped regions in the photolacquer having a very accurate value, in the case described of 1 μm.

If during the manufacture of, for example, semiconductor devices, a photolacquer layer on a wafer is exposed at the reference exposure dose through a mask in which lineshaped regions are present, which upon projection onto the lacquer occupy a width of, for example, 1 μm, it is found that the regions formed after development do not exhibit the desired width of 1 μm. If by experiment the exposure is determined with which the line width has very accurately the desired value (for example by means of a scanning electron microscope), it is found that for all widths in the range of from 0.5 and 2 μm the difference between the required exposure and the reference exposure is a constant value. For a given kind of lacquer, this difference need be determined only once. For each desired line width, the sum of the reference exposure to be determined and the differential value determined once then forms the required exposure. For the photolacquer HPR 204, a differential value of 60 msec was found during experiments. If the reference exposure for regions of 1 μm is determined at 170 msec, the exposure time for accurately obtaining regions having a width of 1 μm in the lacquer layer is 170+60=230 msec.

What is claimed is:

1. A method of determining the exposure dose or exposure time of a photosensitive lacquer layer on a substrate to obtain a lacquer pattern having line widths in the range from 0.5 μm to 2 μm comprising the steps of exposing a photosensitive lacquer layer on a substrate to a raster pattern at a given exposure dose in a first area of said photosensitive lacquer layer, said raster pattern including line-shaped regions of predetermined width, said line-shaped regions being alternately transparent and non-transparent;

then laterally displacing said raster pattern over a distance equal to said predetermined width in a direction at right angles to the longitudinal direction of said line-shaped regions;

thereafter carrying out another exposure of said lacquer layer at said given exposure dose;

selecting a plurality of different areas of said lacquer layer and with a plurality of different exposure doses repeating said steps of exposing, then laterally displacing, and thereafter carrying out another exposure; and determining a reference exposure dose from these repeated steps by developing said lacquer layer, said reference exposure dose being sufficient to just entirely dissolve said lacquer layer after developing.

2. A method according to claim 1, wherein the further steps are carried out of determining an exposure dose for obtaining said predetermined width for a given photosensitive lacquer layer, determining a difference between said exposure dose for obtaining said predetermined width for a given photosensitive lacquer layer and said reference exposure dose obtained under the same process conditions, and choosing for each lot of substrates to be treated an exposure dose equal to a sum of a reference exposure dose to be obtained and the difference value determined.

* * * * *